US 6,602,760 B2

(12) United States Patent
Poortmans et al.

(10) Patent No.: US 6,602,760 B2
(45) Date of Patent: Aug. 5, 2003

(54) METHOD OF PRODUCING A SEMICONDUCTOR LAYER ON A SUBSTRATE

(75) Inventors: Jef Poortmans, Leuven (BE); Giovanni Flamand, Wijnegem (BE); Renat Bilyalov, Tielt-Winge (BE)

(73) Assignees: Interuniversitair Microelektronica Centrum (IMEC), Leuven (BE); Umicore, Brussels (BE)

(*) Notice: Subject to any disclaimer, the term of this patent is extended or adjusted under 35 U.S.C. 154(b) by 0 days.

(21) Appl. No.: 10/032,335

(22) Filed: Dec. 19, 2001

(65) Prior Publication Data
US 2002/0106882 A1 Aug. 8, 2002

Related U.S. Application Data
(60) Provisional application No. 60/257,420, filed on Dec. 22, 2000.

(30) Foreign Application Priority Data
Dec. 21, 2000 (EP) .............................. 00870312

(51) Int. Cl.$^7$ ................................. H01L 21/46
(52) U.S. Cl. .................. 438/455; 438/458; 438/409
(58) Field of Search ........................... 438/455, 458, 438/459, 22, 26, 23, 29, 406, 409; 257/613, 616, 79

(56) References Cited
U.S. PATENT DOCUMENTS

| 4,529,455 A | 7/1985 | Bean et al. | |
|---|---|---|---|
| 4,806,996 A | 2/1989 | Luryi | |
| 5,374,581 A | 12/1994 | Ichikawa et al. | |
| 5,439,843 A | 8/1995 | Sakaguchi et al. | |
| 5,854,123 A | 12/1998 | Sato et al. | |
| 5,856,229 A | * 1/1999 | Sakaguchi et al. | 438/406 |
| 6,107,213 A | 8/2000 | Tayanaka | |
| 6,143,628 A | * 11/2000 | Sato et al. | 438/455 |
| 6,194,239 B1 | 2/2001 | Tayanaka | |
| 6,194,245 B1 | 2/2001 | Tayanaka | |
| 6,326,279 B1 | * 12/2001 | Kakizaki et al. | 438/406 |

FOREIGN PATENT DOCUMENTS

| EP | 0 528 229 A2 | 2/1993 |
|---|---|---|
| EP | 0 553 856 A2 | 8/1993 |
| EP | 0 767 486 A2 | 4/1997 |
| EP | 0 797 258 A2 | 9/1997 |
| JP | 05218464 | 8/1993 |

OTHER PUBLICATIONS

Bilyalov, R.R., et al., "Thin Silicon Films for Solar Cells Based on Porous Silicon", 16$^{th}$ European Photovoltaic Solar Energy Conference, pp. 1536–1540, (May 1–5, 2000).

* cited by examiner

Primary Examiner—Tuan H. Nguyen
(74) Attorney, Agent, or Firm—Knobbe, Martens, Olson & Bear LLP

(57) ABSTRACT

A method of producing a semiconductor layer onto a semiconductor substrate. The method comprises providing a first semiconductor substrate, and providing a second semiconductor substrate. The method also comprises producing a porous layer, which has a porosity profile, on top of the first semiconductor substrate, and producing a porous layer, which has a porosity profile, on top of the second semiconductor substrate. The method further comprises bringing the porous layer of the second substrate into contact with the porous layer of the first substrate, so as to form a bond between the two substrates, performing a thermal annealing step, and lifting off of the second substrate, leaving a layer of the second substrate's semiconductor material attached to the first substrate.

12 Claims, 2 Drawing Sheets

METHOD OF PRODUCING A SEMICONDUCTOR LAYER ON A SUBSTRATE

This application claims priority to, and incorporates herein in its entirety, U.S. provisional patent application entitled "A METHOD OF PRODUCING A SEMICONDUCTOR LAYER ON A SUBSTRATE", having Application No. 60/257,420, and filed on Dec. 22, 2000.

FIELD OF THE INVENTION

The present invention is related to a method of realising a bond between a substrate, preferably a Si-substrate and a thin semiconductor layer, such as a Ge layer. The present invention is equally related to products resulting from such a method.

STATE OF THE ART

Ge-substrates are often used as a substrate for the growth of active III–V devices (e.g. multijunction monolithic cascade solar cells or LED's). However, a Ge-substrate is much more expensive than a Si-substrate, and more importantly, Si has a much higher strength than Ge (by a factor of 2) and lower density.

Therefore, the realisation of a Ge-layer on a Si-substrate has gained a large importance for the production of opto-electronic applications.

The epitaxial growth of GaAs layers on Ge-substrates is known to give good results due to the good lattice match between these two materials. When it comes to growing Ge (or GaAs) layers on Si, however, problems occur due to a lattice mismatch of over 4% for both Ge and GaAs, compared to Si.

First of all, techniques are documented in the literature, to combine Si and GaAs.

Document U.S. Pat. No. 4,959,308 describes a method of forming a GaAs layer on Si wherein a defect annihilating grid is formed on the Si substrate prior to the epitaxy of GaAs, in order to reduce the effects of lattice mismatch.

Known methods of producing GaAs layers on Si-substrates however do not allow to produce GaAs layers with defect densities lower than $10^5$–$10^6$ cm$^{-2}$, which is still one order of magnitude too high to realise devices with a good energy conversion efficiency.

Document U.S. Pat. No. 4,806,996 describes a device wherein an epitaxial layer, such as Ge or GaAs is formed on a single crystal substrate, such as a Si substrate, and wherein the surface of said substrate is suitably patterned in order to reduce lattice mismatch effects. The process required for producing said device is however complex and comprises many process steps.

Alternatively, methods have been reported of realising a graded layer of SiGe, which is rich in Si at the Si substrate and gradually becomes pure Ge near the top of the layer.

By the Ge-grading, the number of threading dislocations is kept low, because the misfit dislocations bend sidewards. The grading, which is optimally in the order of a change of 10% Ge per μm, is realised by adapting the growth parameters during growth. Growth of GaAs-layers on such graded buffer layers of Ge on Si has been realised and photoluminescence measurements give evidence of the good quality of the GaAs epitaxial layer.

A method of growing such a GexSi1-x layer on a Si substrate by molecular beam epitaxy is described in document U.S. Pat. No. 4,529,455.

A drawback of this kind of graded layer is the cost of the process used, which is comparable to the cost of the Ge-substrate. This is a consequence of the growth procedure used.

AIMS OF THE INVENTION

The method according to the present invention aims to provide a stable bond preferably between a semiconductor substrate and a semiconductor layer, without applying intermediate layers, patterning of the substrate or epitaxy of a graded layer.

SUMMARY OF THE INVENTION

The present invention is related to a method of producing a semiconductor layer onto a semiconductor substrate, comprising the steps of:

Providing a first semiconductor substrate,
Providing a second semiconductor substrate,
Producing a porous layer on top of said first semiconductor substrate, said layer having a porosity profile,
Producing a porous layer on top of said second semiconductor substrate, said layer having a porosity profile,
Bringing said porous layer of said second substrate into contact with said porous layer of said first substrate, so as to form a bond between said two substrates,
Performing a thermal annealing step,
Lifting off said second substrate, leaving a layer of said second substrate's semiconductor material attached to said first substrate.

Said porosity profile of said second substrate may be formed by a first layer of high porosity adjacent to said second substrate's surface, followed by a second layer of lower porosity and a third layer of high porosity.

Said porosity profile of said first substrate may be formed by a first layer of high porosity adjacent to said first substrate's surface, followed by a second layer of lower porosity.

According to a preferred embodiment, a layer of the material of said second substrate is formed on top of said first substrate, said layer comprising a number of voids.

Said first substrate may be a Si-substrate and said second substrate a Ge-substrate. Said first substrate may be a Si substrate and said second substrate a GaAs substrate. Both said first and said second substrates may be Si substrates.

Said forming of porous layers may be done by an anodization step.

The method according to the invention may comprise the steps of:

forming a porous layer on said second substrate through anodization in a solution of HF and acetic acid,
bringing said first substrate into contact with said second substrate while said second substrate is still in the solution used to perform said anodization.

According to another embodiment, the method according to the invention comprises the steps of:

forming a porous layer on said second substrate through anodization in a solution of HF and acetic acid,
removing said second substrate from said solution,
bringing said first substrate into contact with said second substrate.

The present invention is equally related to a semiconductor device, produced with the method of the invention. Said device may be an opto-electronic device.

SHORT DESCRIPTION OF THE DRAWINGS

DETAILED DESCRIPTION OF THE DRAWINGS

The present invention is related to a method of producing a thin layer of a first semiconductor material onto a substrate made of the same or another semiconductor material, by bringing two substrates of said respective materials into contact with each other. It is necessary that the two substrates have a 'porosity profile' under their surface. In its simplest form, this profile is defined by a top layer having a given higher porosity than the substrate underneath said top layer. Other more complex profiles are possible, as set out further in this description. These two substrates are then brought into contact in such circumstances as to form a bond between said two substrates. It is then the phenomenon of lift-off, preferably spontaneous or mechanical lift-off, which causes one of the substrates to be removed, leaving a thin layer of said removed substrate's material attached to the other substrate. In terms of composition, grading, mechanical and other properties, the layer that is formed depends on the original porosity profiles of the two substrates, and on the process parameters (annealing temperatures, environment, etc . . . ).

Figure 1:
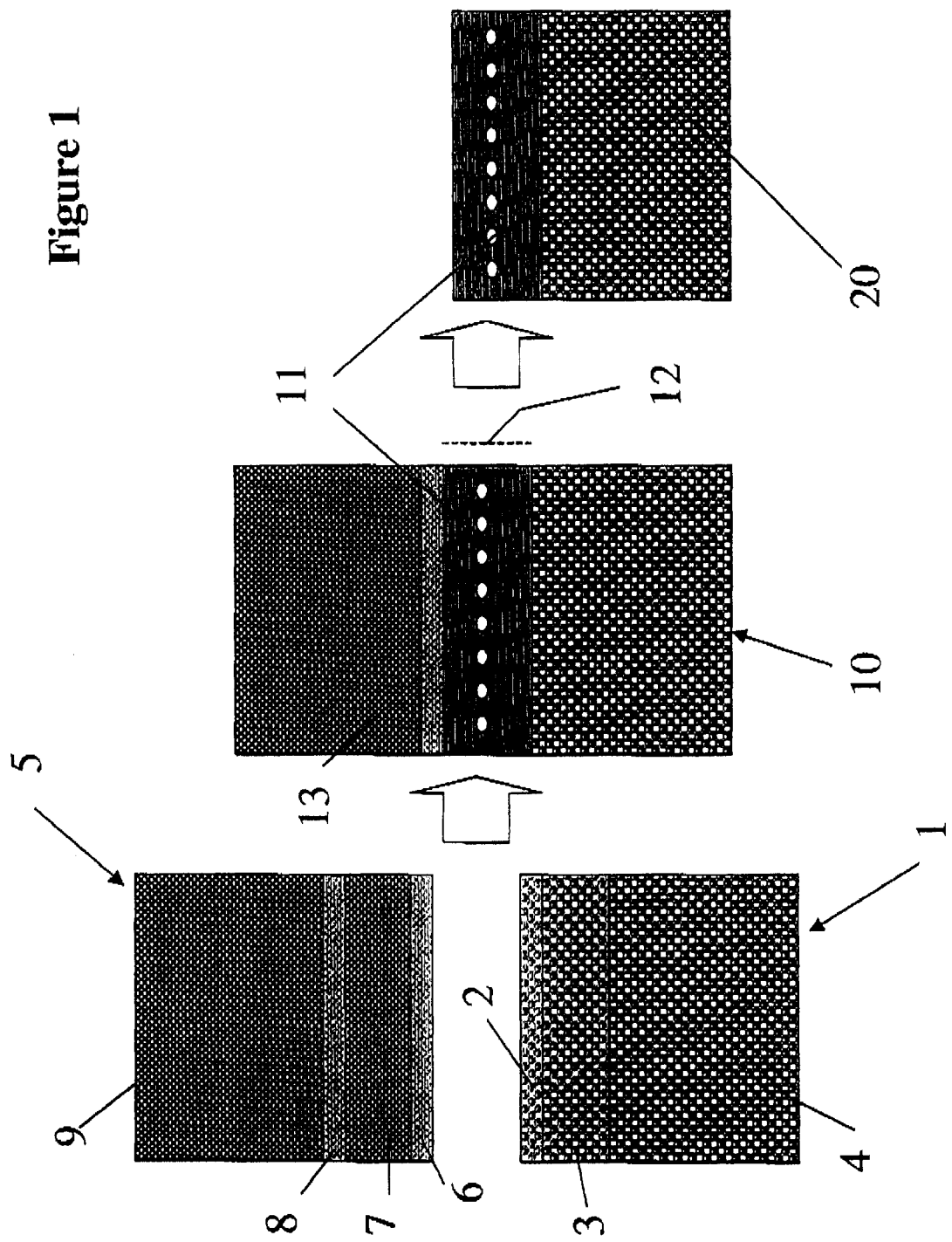
FIG. 1 illustrates the principle of the method according to the present invention.

A schematic overview of a preferred embodiment of the method according to the invention is illustrated in FIG. 1. A silicon substrate 1 is provided, having a top layer 2 of high porosity, above a sublayer 3 of lower porosity and the base substrate 4, which has a lower porosity than both layers 2 and 3. Further, a Ge-substrate 5 is provided, having a top layer 6 with high porosity, a first sublayer 7 of lower porosity and a second sublayer 8 of high porosity adjacent to the base substrate 9, the latter having lower porosity than either of the layers 6, 7 and 8. These substrates and their porosity profiles are produced according to any known method. The thickness of the porous layers (6+7+8) on the Ge-substrate preferably lies between 1 μm and 5 μm, that of the porous layer on the Si substrate (2+3) preferably lies between 2 μm and 10 μm. The porosity of the Ge-layers preferably lies between the following limits (expressed in % air, i.e. pores in a given volume of the layer): 50–60% (layer 6), <50% (layer 7), 60–70% (layer 8). The porosity of the silicon layers lies preferably between the following limits: 50–60% (layer 2), 20–40% (layer 3).

By bringing the two porous layers 2 and 6 in mutual contact, and by performing an annealing step to strengthen said contact, a bond is formed and the porous layers reorganise because of the enhanced diffusivity of Ge and Si atoms, during the thermal anneal. As a result, a structure 10 is formed. The low-porosity part of the Ge (layer 7) has grown more dense whereas the high porosity part of Si and Ge (layers 2 and 6) have merged through interdiffusion and formed buried voids 11.

Depending on the process parameters, this structure is such that the region 12, due to densifying and diffusion, essentially comprises pure Ge in its top section 13. Under this section, the composition then gradually changes to a $Si_{1-x}Ge_x$ composition, with a growing percentage of Si in layers approaching the Si substrate. In the section where the two original porous top layers made contact, interdiffusion of Si and Ge has now formed a series of voids 11, which are particularly advantageous for certain aspects of the invention, as will be explained later.

The production of the final device 20 occurs through the so-called 'lift-off' phenomenon. When the change in porosity is sufficiently large, spontaneous lifting-off of a porous layer from a substrate can occur. In the case of the structure 10, this phenomenon takes place when the top of region 12 has become sufficiently dense: at this point, the porous layer 8, along with the entire Ge-substrate is lifted off at section 13, resulting in the device 20. To have spontaneous lift-off, layer 8 must have sufficient porosity. If the porosity is lower than the required limit, mechanical lift-off may still be possible. This means that the breaking off of the Ge-layer is induced by a small mechanical force (for example exerted by a pair of tweezers). According to the invention, the thermal anneal may come before or after the lift-off, or both may occur essentially simultaneously as is illustrated further in this text in some preferred embodiments of the process steps of the method of the invention.

The resulting device 20 is characterised by a Si base substrate, pure Ge on top, and an intermediate $Si_{1-x}Ge_x$ layer having a graded composition and a number of voids 11. The number and size of said voids depends on the original porosity of the porous layers.

These voids have a double function. The first is to relieve the stresses resulting from the mismatch between the two materials and the second is to act as a buried reflector in between the two materials, which increases the energy conversion efficiency of solar cells or increases the emission efficiency of LED's.

In the case of Si—Ge bonds, the method of the invention allows to produce such devices at a considerably lower cost than existing methods, due to its economic use of Ge. In fact, a Ge substrate can be re-used several times after having been involved in the above described process. This way, one Ge-substrate may produce numerous thin Ge-layers.

Figure 2:
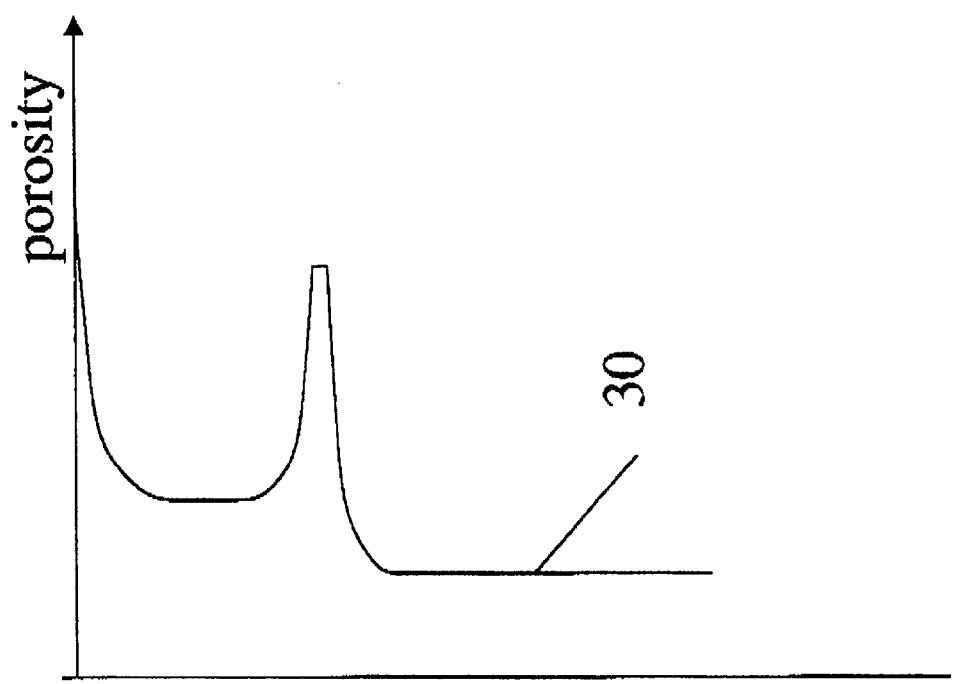
FIG. 2 represents a substrate with a porosity profile along a curve.
Figure 2:
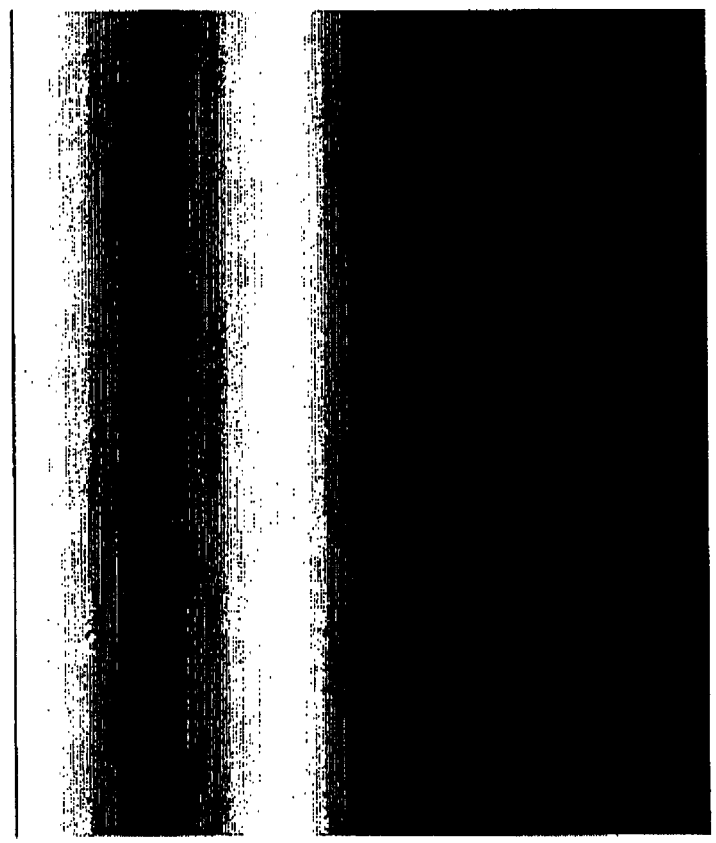

An important aspect of the present invention concerns the porosity profile in the two substrates which are brought together. The double change in porosity as shown in the preferred embodiment of FIG. 1 is used to produce the graded Ge-layer described. Layers with other properties (not necessarily graded) are produced starting from substrates with other porosity profiles. Also, the transition between high porosity and low porosity zones need not be as discontinuous as in FIG. 1. FIG. 2 shows a similar profile, wherein the change in porosity takes place along a continuous curve 30, as a function of depth.

The method of the invention is not limited to the forming of bonds between Si and Ge. Other bonds such as Si/Si and Si/GaAs can be produced by this method.

Preferred Embodiments of Process Steps According to the Invention

According to a first preferred embodiment, the method of the invention comprises the following steps:

Step 1: Production of a Si substrate having a porous Si top layer, with the profile of FIG. 1.

A porous Si-film is created on top of the Si substrate by anodization carried out in a conventional Teflon cell with a silicon sample as an anode and a platinum counter electrode as a cathode. The solution of HF and acetic acid is used as an electrolyte. The concentration of HF in acetic acid is chosen higher than 20% to form a low porosity layer at a current density of more than 100 mA/cm$^2$, which provides a high electro-chemical etching rate. A layer of different porosity can be formed by changing the current density and/or by changing the HF concentration in the solution. The electrochemical etching is carried out at room temperature and background illumination.

Step 2: production of the Ge-substrate with porosity profile as in FIG. 1.

The porous Ge-layer is realised on a p-type Ge-substrate, having a doping level in the range from $10^{15}$ to $10^{17}$ cm$^{-3}$. The porous Ge-layer is realised by anodization in a Teflon Cell. The composition of the mixture is as follows: 1 part HF (49% in H$_2$O)/1 part H$_2$O/2 parts ethanol. The window to realise such layer is narrow and small deviations of the concentrations mentioned (about 10%) results in rough layers or electropolishing. After an incubation period in which electropolishing occurs which removes about 10 µm of Ge, a porous Ge-layer is being formed. By simultaneous etching of the top surface and further progress of the porous Ge/Ge interface, the thickness of the porous layer is limited to about 2 µm. When a similar porous layer is created on an n-type Ge-substrate, having a doping level between 5×10$^{16}$ and 5×10$^{17}$ cm$^{-3}$, the porous Ge is created in a mixture which is the same as above, but the allowable deviations of the composition are much larger. The layer created contains macroporous material, which does not lift-off as such.

Step 3: bringing the two substrates in contact

By putting a Si-piece with the surface made porous on top of the porous Ge-surface with the Ge-sample still in the solution, curling-up of the Ge-film can be avoided and the Ge-film transferred to the Si-surface. The porosity gradient in the layer is created simultaneously with the formation. The average porosity of the thus formed layer is between 25 and 40%.

Step 4: removing the substrates from the solution and causing lift-off of the Ge-layer from the Si-substrate.

Depending on the porosity of layer 8 in the Ge-substrate, this lift-off will be spontaneous or mechanical.

Step 5: thermal anneal

This is typically done at temperatures between 900° C. and 1050° C. in a non-oxidising atmosphere, such as H2. During this step, the porous layers reorganise because of the enhanced diffusivity of Ge and Si atoms. As a result, the low-porosity part of the Ge (layer 7) will densify whereas the high porosity part of Si and Ge will interdiffuse and form buried voids.

The order of the thermal anneal step and the lift-off step may be reversed, or both steps may take place simultaneously.

According to a second preferred embodiment, the steps 1 and 2 are the same, but the Ge-substrate is first removed from the solution and then brought into contact with the Si-substrate, after which thermal anneal and lift-off are performed.

Other embodiments of the invention depend on the exact porosity profiles of both substrates. For example, if the Si-substrate has a similar profile than the Ge-substrate (see FIG. 1), lift-off will occur both of the Ge-substrate and the Si-substrate, leaving a thin Si-Ge film as the resulting product.

What is claimed is:

1. A method of producing a semiconductor layer onto a semiconductor substrate, comprising the steps of:

producing a first porous layer on top of a first semiconductor substrate, said first porous layer having a first porosity profile;

producing a second porous layer on top of a second semiconductor substrate, said second porous layer having a second porosity profile;

bringing said second porous layer into contact with said first porous layer, so as to form a bond between said first and second substrates;

performing a thermal annealing step; and lifting off said second substrate, leaving a layer of material of said second substrate attached to said first substrate.

2. The method according to claim 1, wherein said second porosity profile is formed by a first layer of high porosity adjacent to the surface of said second substrate, followed by a second layer of lower porosity and a third layer of higher porosity.

3. The method according to claim 1, wherein said first porosity profile is formed by a first layer of high porosity adjacent to the surface of said first substrate, followed by a second layer of lower porosity.

4. The method according to claim 1, wherein a layer of the material of said second substrate is formed on top of said first substrate, said layer of the material of said second substrate comprising a number of voids.

5. The method according to claim 1, wherein said first substrate comprises a Si-substrate and said second substrate comprises a Ge-substrate.

6. The method according to claim 1, wherein said first substrate comprises a Si-substrate and said second substrate comprises a GaAs substrate.

7. The method according to claim 1, wherein each of said first and said second substrates comprises Si substrates.

8. The method according to claim 1, wherein said step of producing the first and second porous layers comprises anodization.

9. The method according to claim 8, further comprising the steps of:

forming a porous layer on said second substrate through anodization in a solution of HF and acetic acid; and bringing said first substrate into contact with said second substrate while said second substrate is still in the solution and during said anodization.

10. The method according to claim 8, further comprising the steps of:

forming a porous layer on said second substrate through anodization in a solution of HF and acetic acid;

removing said second substrate from said solution; and bringing said first substrate into contact with said second substrate.

11. A semiconductor device produced in accordance with the method of claim 10.

12. The device according to claim 11, wherein said device comprises an opto-electronic device.

* * * * *